United States Patent
Lai (10) Patent No.: US 7,473,570 B2
(45) Date of Patent: Jan. 6, 2009

(54) METHOD FOR FORMING EPITAXIAL LAYERS OF GALLIUM NITRIDE-BASED COMPOUND SEMICONDUCTORS

(75) Inventor: Mu-Jen Lai, Chungli (TW)

(73) Assignee: Supernova Optoelectronics Corporation, Taoyuan County (TW)

( * ) Notice: Subject to any disclaimer, the term of this patent is extended or adjusted under 35 U.S.C. 154(b) by 41 days.

(21) Appl. No.: 11/441,036

(22) Filed: May 26, 2006

(65) Prior Publication Data
US 2007/0272943 A1    Nov. 29, 2007

(30) Foreign Application Priority Data
May 5, 2006    (TW) .............................. 95116058 A (51) Int. Cl.
*H01L 21/00* (2006.01)
*H01L 21/28* (2006.01)
(52) U.S. Cl. ............................ 438/45; 438/46; 438/602; 438/604; 257/E33.023
(58) Field of Classification Search ................. 438/123, 438/45–47, 602, 604
See application file for complete search history.

(56) References Cited

U.S. PATENT DOCUMENTS
6,084,899 A * 7/2000 Shakuda .................. 372/45.01

FOREIGN PATENT DOCUMENTS
JP    A-07-129026    5/1995

* cited by examiner

*Primary Examiner*—Thanh Nguyen
(74) *Attorney, Agent, or Firm*—Rosenberg, Klein & Lee (57) ABSTRACT

The present invention relates to a structure and a manufacturing method of epitaxial layers of gallium nitride-based compound semiconductors with less dislocation densities. Surface treatment is carried out first on the surface of a substrate using reaction precursors $Cp_2Mg$ and $NH_3$. Then a gallium nitride-based buffer layer is formed on the substrate to form a semiconductor epitaxial structure with an interface layer or an interface zone between the substrate and the buffer layer. The structure can reduce effectively the dislocation density formed in the gallium nitride-based epitaxial layer on top of the gallium nitride-based buffer layer. Thereby, high-quality epitaxial layers tend to be attained and the uniformity of the dislocation density can be enhanced.

5 Claims, 9 Drawing Sheets

METHOD FOR FORMING EPITAXIAL LAYERS OF GALLIUM NITRIDE-BASED COMPOUND SEMICONDUCTORS

FIELD OF THE INVENTION

The present invention relates generally to a structure and a manufacturing method of epitaxial layers of gallium nitride-based compound semiconductors, and particularly to a structure and a manufacturing method of epitaxial layers of gallium nitride-based compound semiconductors with relatively perfect crystals and with reduced dislocations.

BACKGROUND OF THE INVENTION

In modern light-emitting devices, gallium nitride-based materials are very important wide-bandgap semiconductor materials, which can be applied to green, and blue to ultraviolet light-emitting devices. However, the formation of bulk gallium nitride is hitherto a technical bottleneck difficult to breakthrough. By using sapphire or silicon carbide (SiC) as a substrate, a gallium nitride layer can grow epitaxially onto the substrate. Nevertheless, a substantially high dislocation density exists in the gallium nitride layer fabricated using such a process, resulting in reduction in luminance efficiency and electron mobility, and thereby a light-emitting diode with relatively higher luminance efficiency cannot be attained.

In view of the considerations, U.S. Pat. No. 5,290,393 discloses forming a low-temperature gallium nitride buffer layer at temperatures between 200° C. to 900° C. and with a thickness of between 0.001 µm to 0.5 µm on a sapphire substrate, and then forming a high-temperature gallium nitride layer at temperatures between 900° C. to 1150° C. Although the method can increase crystallizability of the gallium nitride-based materials, the dislocation density of the whole gallium nitride layer is as high as $10^9$ to $10^{10}$ cm$^{-2}$. Another US patent with U.S. Pat. No. 6,252,261 discloses reducing dislocation density in the gallium nitride layer during subsequent epitaxial growth by using an epitaxial lateral overgrowth (ELOG) method. Although the method can reduce dislocation density effectively, an approximate thickness of 10 µm is required to reduce the dislocation density below $1 \times 10^8$ cm$^{-2}$. In addition, production cost is relatively high because of mask fabrication in the processes and complex control mechanisms in selective growth. Furthermore, U.S. Pat. No. 6,475,882 discloses a lateral epitaxial technology using silicon nitride (SiN) micro-masks. However, the drawback of the technology disclosed in the patent is that the uniformity and the density of the SiN micro-masks are difficult to control, which will result in difficulty in controlling production yields. Moreover, U.S. Pat. No. 6,700,179 discloses a surface treatment technology using silicon as an anti-surfactant, which can attain better crystallization of subsequent epitaxial layers by controlling the reaction time of the reaction precursor SiH$_4$. However, the drawback thereof is still difficulty in controlling uniformity as well as density. Bad uniformity tends to result in non-uniformity of stress distribution in the epitaxial layers, which in turn will result in difficulty in controlling production yields.

Consequently, in accordance with the problems described above, the present invention provides a structure and a manufacturing method of epitaxial layers of gallium nitride-based compound semiconductors.

SUMMARY

The purpose of the present invention is to provide a structure and a manufacturing method of epitaxial layers of gallium nitride-based compound semiconductors, which can manufacture high-quality epitaxial layers with substantially reduced dislocations.

Another purpose of the present invention is to provide a structure and a manufacturing method of epitaxial layers of gallium nitride-based compound semiconductors, which can increase effectively the luminance efficiency and lifetime of light-emitting devices.

Still another purpose of the present invention is to provide a structure and a manufacturing method of epitaxial layers of gallium nitride-based compound semiconductors, which can increase effectively production yields, and thereby can reduce costs due to product failure and enhance product competitiveness.

The structure of epitaxial layers of gallium nitride-based compound semiconductors according to the present invention includes a substrate, a gallium nitride-based buffer layer, and an interface layer or an interface zone, which is formed by surface treatment on the substrate using reaction precursors Cp$_2$Mg and NH$_3$, and is located between the substrate and the gallium nitride-based buffer layer.

Another embodiment of the present invention is a manufacturing method of the epitaxial layers of gallium nitride-based compound semiconductors described above. The method comprises providing a substrate first, surface treatment on the substrate using reaction precursors Cp$_2$Mg and NH$_3$, forming a low-temperature gallium nitride-based buffer layer, and forming a high-temperature gallium nitride-based buffer layer on the low-temperature gallium nitride-based buffer layer.

Another embodiment of the present invention is a manufacturing method of the epitaxial layers of gallium nitride-based compound semiconductors described above. The method comprises providing a substrate first, surface treatment on the substrate using reaction precursors Cp$_2$Mg and NH$_3$, forming a low-temperature gallium nitride-based stacked buffer layer stacked by a plurality of low-temperature gallium nitride-based buffer layers and surface treatment being carried out therebetween, and forming a high-temperature gallium nitride-based buffer layer on the low-temperature gallium nitride-based stacked buffer layer.

Still another embodiment of the present invention is a manufacturing method of the epitaxial layers of gallium nitride-based compound semiconductors described above. The method comprises providing a substrate first, surface treatment on the substrate using reaction precursors Cp$_2$Mg and NH$_3$, forming a gallium nitride-based buffer layer, and forming sequentially an n-type gallium nitride-based contact layer, a light-emitting layer, a p-type gallium nitride-based over layer, and a p-type gallium nitride-based contact layer on the gallium nitride-based buffer layer.

In order to make the structure and characteristics as well as the effectiveness of the present invention to be further understood and recognized, the detailed description of the present invention is provided as follows along with preferred embodiments and accompanying figures.

DETAILED DESCRIPTION

The present invention relates to a structure and a manufacturing method of epitaxial layers of gallium nitride-based compound semiconductors, which uses reaction precursors Bis(cyclopentadienyl) magnesium ($Cp_2Mg$) and $NH_3$ to carry out surface treatment on a substrate to change energy states of the surface of the substrate, so that epitaxial layers of gallium nitride-based compound semiconductors formed subsequently on the substrate can have perfect lattice structure and a low dislocation density. The material of the epitaxial layers of gallium nitride-based compound semiconductors is chosen from the group consisting of $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$ $x+y+z=1$, $p+q=1$) and $P-B_xAl_yIn_zGa_{1-x-y-z}N_pP_q$ layer ($0 \leq x \leq 1$, $0 \leq y \leq 1$, $0 \leq z \leq 1$, $0 \leq p \leq 1$, $0 \leq q \leq 1$ and $x+y+z=1$ and $p+q=1$). The material of the substrate is chosen from the group consisting of sapphire, SiC, ZnO, $ZrB_2$, and Si.

Figure 1A:
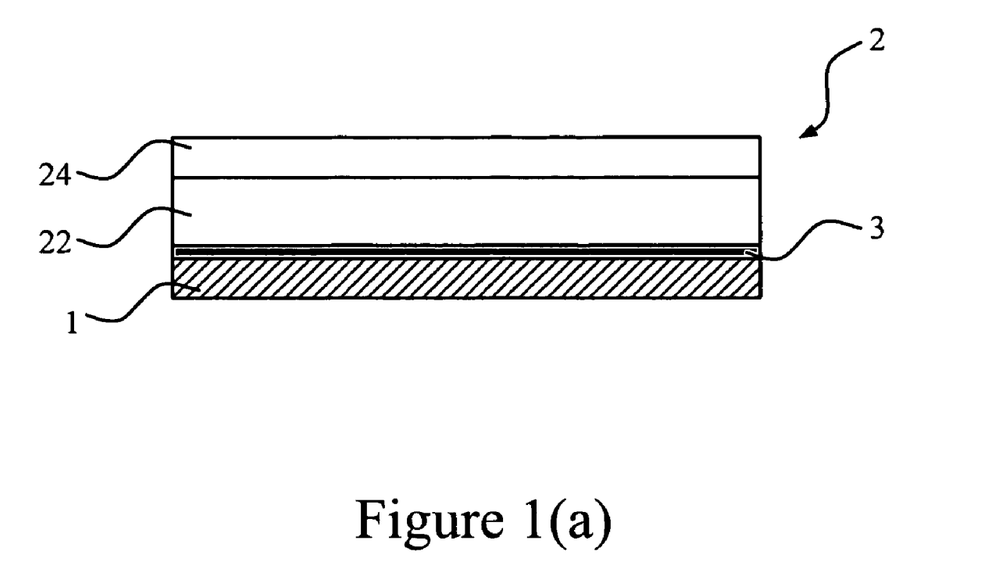
FIG. 1(a) is a structural schematic diagram according to the present invention.

First, FIG. 1(a) is a structural schematic diagram of an epitaxial layer of gallium nitride-based compound semiconductors according to the present invention. The epitaxial structure according to the present invention includes a substrate 1, a gallium nitride buffer layer 2 on the substrate 1, and an interface layer or an interface zone 3, which is located between the substrate and the gallium nitride-based buffer layer, and is formed by surface treatment on the substrate using reaction precursors $Cp_2Mg$ and $NH_3$, wherein the gallium nitride-based buffer layer can include a low-temperature gallium nitride-based buffer layer 22 as well as a high-temperature gallium nitride-based buffer layer 24, as shown in FIG. 1(a).

Figure 1B:
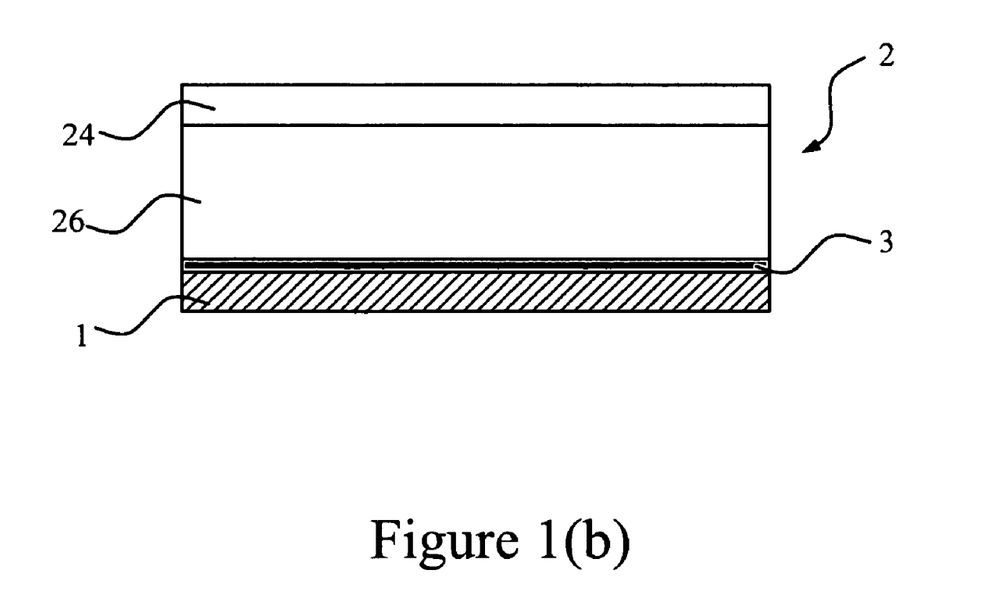
FIG. 1(b) is another structural schematic diagram according to the present invention.

Alternatively, the gallium nitride-based buffer layer 2 includes a stacked layer 26 and a high-temperature gallium nitride-based buffer layer 24, wherein the stacked layer 26 is stacked by a plurality of low-temperature gallium nitride-based buffer layers and surface treatment being carried out therebetween, as shown in FIG. 1(b).

Figure 2:
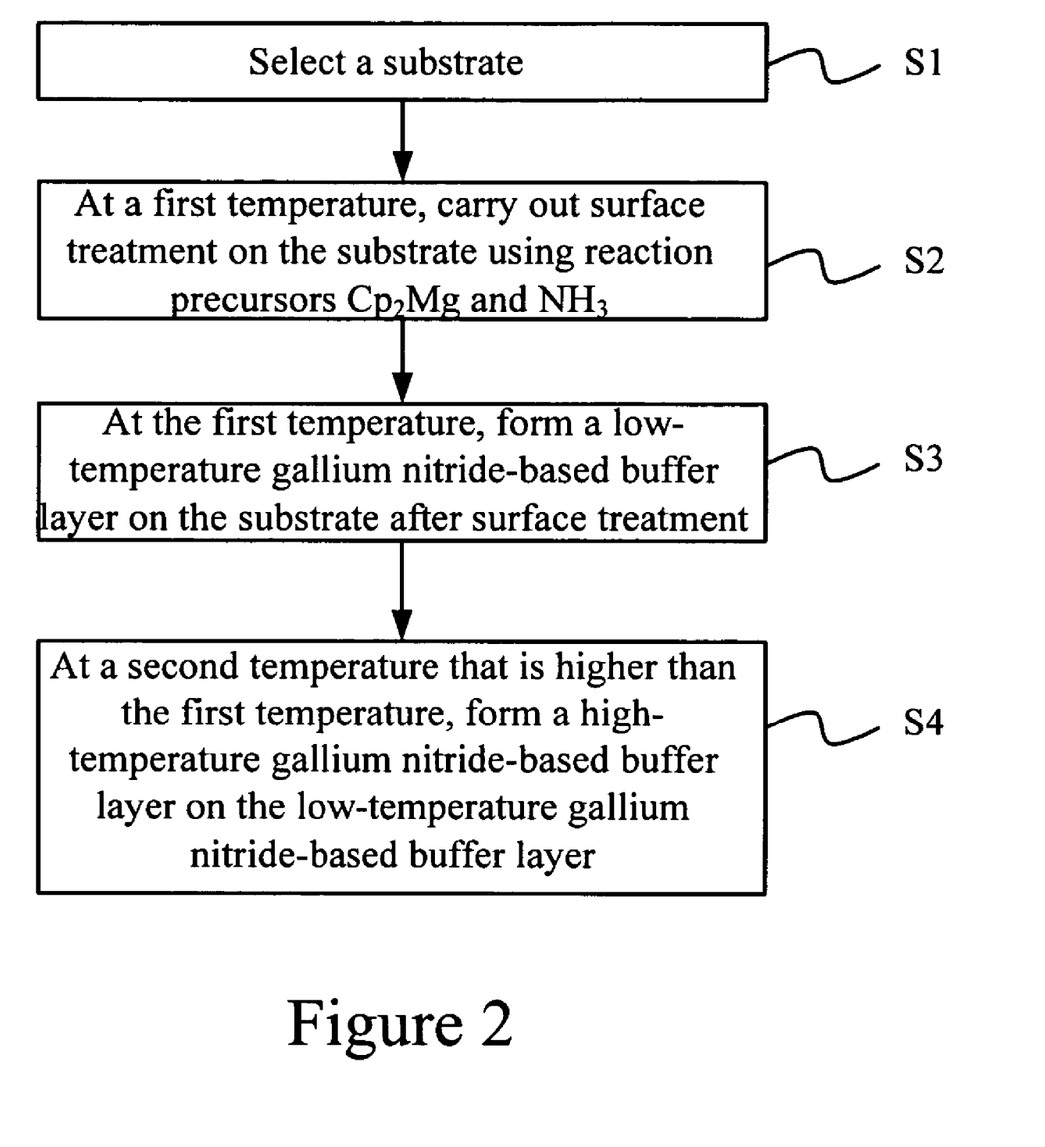
FIG. 2 is a flow chart according to a preferred embodiment of the present invention.

In the following, the manufacturing method of the epitaxial structure described above is described:

First, FIG. 2 is a flow chart according to a first embodiment of the present invention. As the step S1, select a substrate. Then, as the step S2, at a first temperature, carry out surface treatment on the substrate using reaction precursors $Cp_2Mg$ and $NH_3$. Afterwards, as the step S3, at the first temperature, form a low-temperature gallium nitride-based buffer layer on the substrate after surface treatment. Finally, as the step S4, at a second temperature, form a high-temperature gallium nitride-based buffer layer on the low-temperature gallium nitride-based buffer layer, wherein the second temperature is higher than the first temperature.

Figure 3:
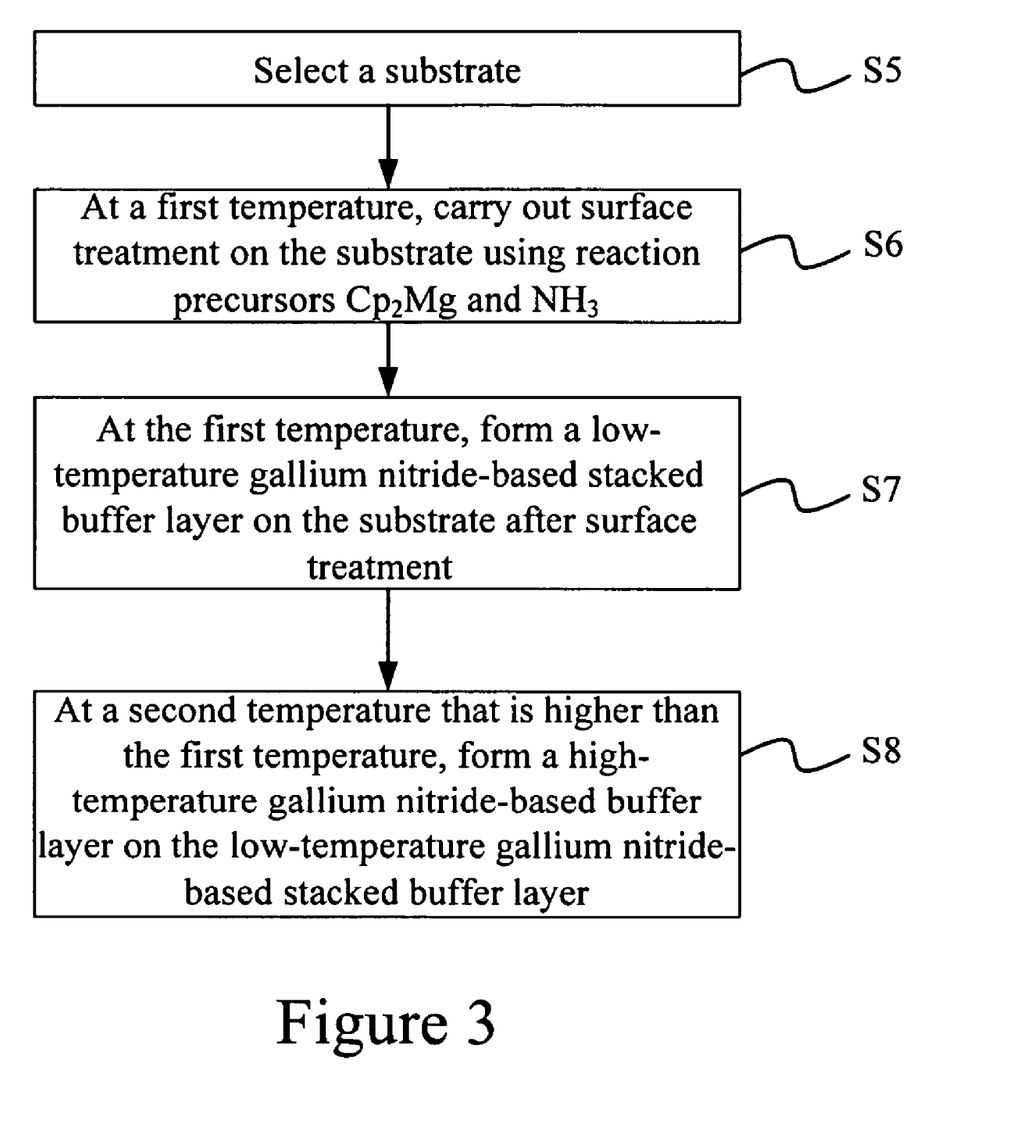
FIG. 3 is a flow chart according to another preferred embodiment of the present invention.

FIG. 3 is a flow chart according to a second embodiment of the present invention. As the step S5, select a substrate. Then, as the step S6, at a first temperature, carry out surface treatment on the substrate using reaction precursors $Cp_2Mg$ and $NH_3$. Afterwards, as the step S7, at the first temperature, form a low-temperature gallium nitride-based stacked buffer layer on the substrate after surface treatment. The low-temperature gallium nitride-based stacked buffer layer is formed by first depositing a low-temperature gallium nitride-based buffer layer, and then by carrying out surface treatment on the substrate using reaction precursors $Cp_2Mg$ and $NH_3$. Next, deposit another low-temperature gallium nitride-based buffer layer on the low-temperature gallium nitride-based buffer layer after surface treatment. After repeating such a process for several times, a low-temperature gallium nitride-based stacked buffer layer stacked by a plurality of low-temperature gallium nitride-based buffer layers with surface treatment being carried out therebetween is attained. Finally, as the step S8, at a second temperature, form a high-temperature gallium nitride-based buffer layer on the low-temperature gallium nitride-based stacked buffer layer, wherein the second temperature is higher than the first temperature.

Figure 4:
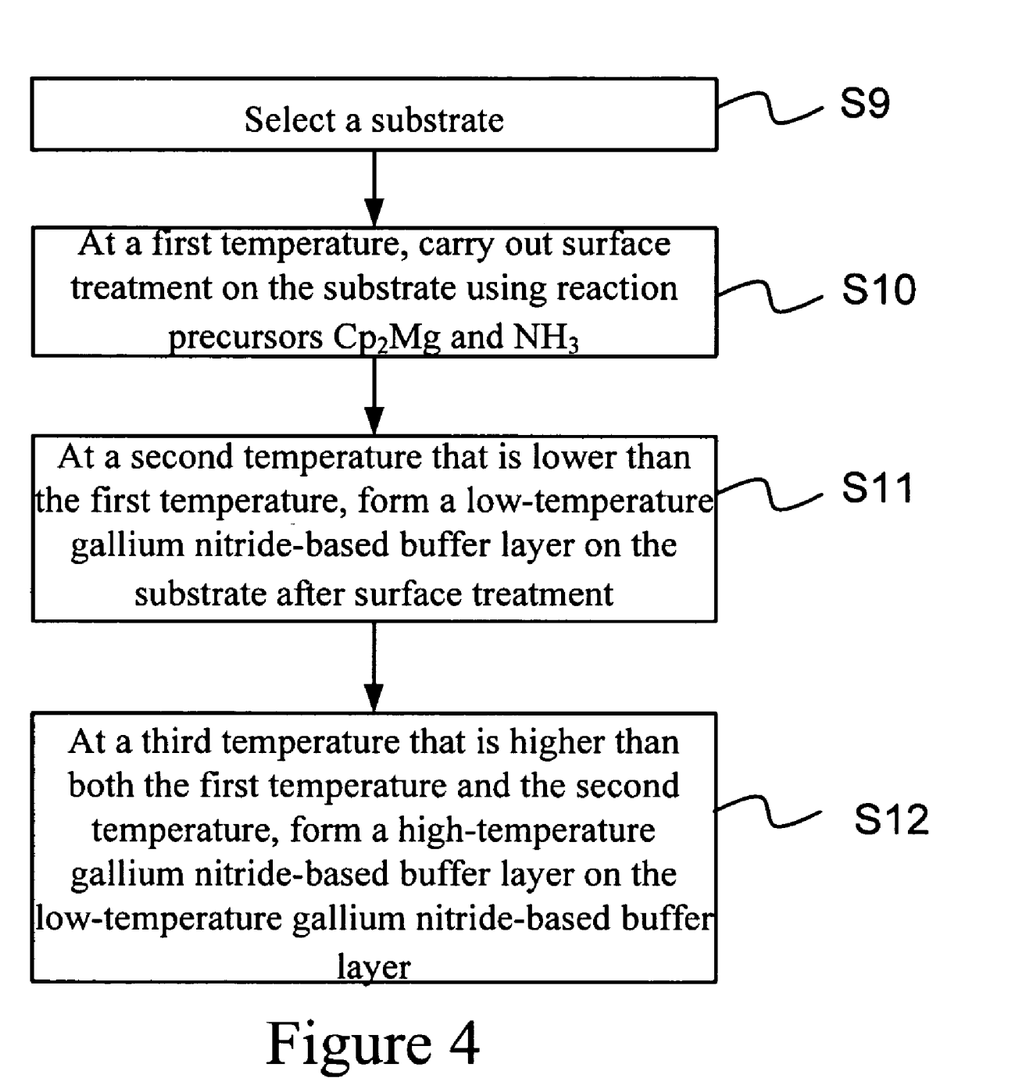
FIG. 4 is a flow chart according to another preferred embodiment of the present invention.

FIG. 4 is a flow chart according to another preferred embodiment of the present invention. As the step S9, select a substrate. Then, as the step S10, at a first temperature, carry out surface treatment on the substrate using reaction precursors $Cp_2Mg$ and $NH_3$. Afterwards, as the step S11, at a second temperature, form a low-temperature gallium nitride-based buffer layer on the substrate after surface treatment. Finally, as the step S12, at a third temperature, form a high-temperature gallium nitride-based buffer layer on the low-temperature gallium nitride-based buffer layer, wherein the third temperature is higher than the first temperature, and the first temperature is higher than the second temperature.

Figure 5:
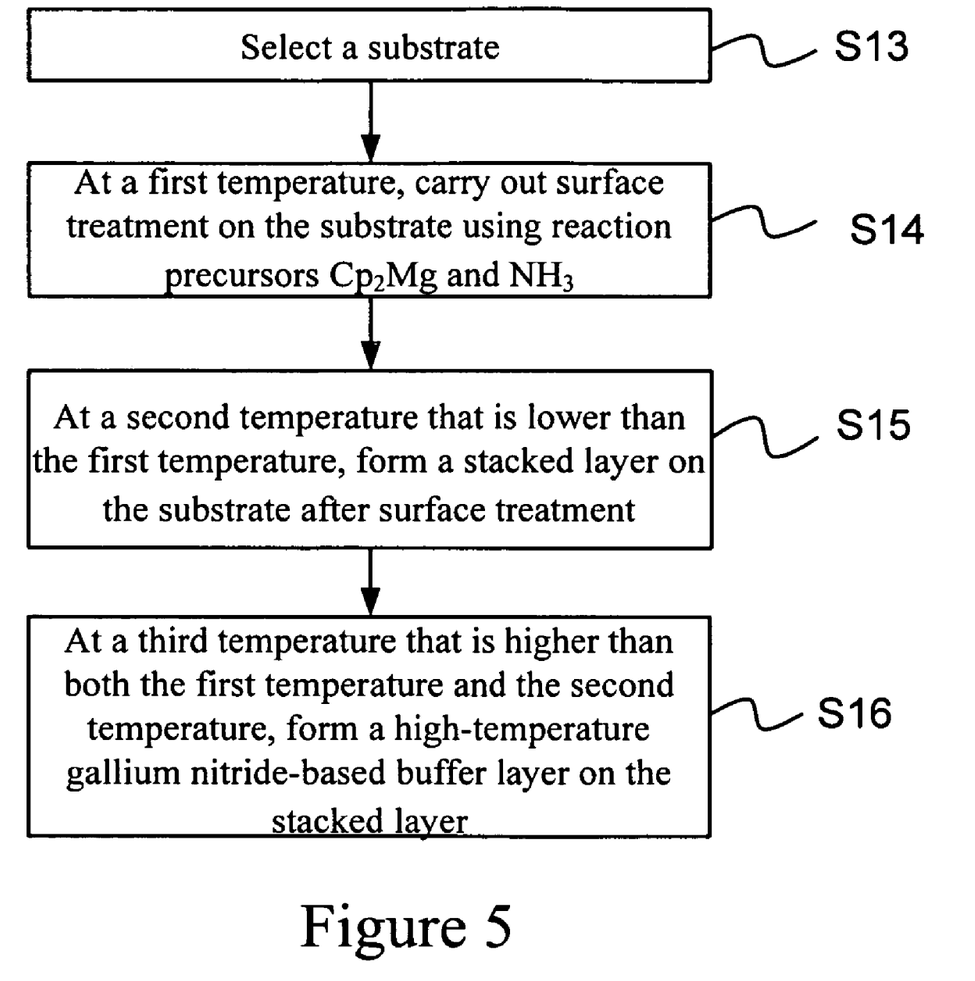
FIG. 5 is a flow chart according to still another preferred embodiment of the present invention.

FIG. 5 is another embodiment according to the present invention. As the step S13, select a substrate. Then, as the step S14, at a first temperature, carry out surface treatment on the substrate using reaction precursors $Cp_2Mg$ and $NH_3$. Afterwards, as the step S15, at a second temperature, form a stacked layer stacked by a plurality of low-temperature gallium nitride-based buffer layers on the substrate after surface treatment. The process steps thereof are first depositing a low-temperature gallium nitride-based buffer layer, and then carrying out surface treatment on the substrate using reaction precursors $Cp_2Mg$ and $NH_3$ with the process parameters used in the step S14. Next, deposit another low-temperature gallium nitride-based buffer layer on the low-temperature gallium nitride-based buffer layer after surface treatment. After repeating such a process for several times, a stacked layer stacked by a plurality of low-temperature gallium nitride-based buffer layers with surface treatment being carried out therebetween is attained. Finally, as the step S16, at a third temperature, form a high-temperature gallium nitride-based buffer layer on the stacked layer, wherein the third temperature is higher than the first temperature, and the first temperature is higher than the second temperature.

As it should be, in the embodiments described above, the process will not terminate after forming the gallium nitride-based buffer layers. For example, in the process of fabricating light-emitting diodes (LED), the process steps of fabricating gallium nitride-based compound LED light-emitting device part (being light-emitting structures with any conventional p/n junctions or n/p junctions, wherein the material can be a gallium nitride compound) and of fabricating electrodes at proper positions will be carried out subsequently. However, for understanding that the main technical content of the present invention is on solving the problem, which exists for a long time, of lattice mismatch in buffer layers located between the substrate and the LED light-emitting device, the subsequent processes will not be describe in further detail thereafter.

In the following, four embodiments with detailed process parameters are used to describe the present invention. However, the person skilled in the art should aware that many process parameters, such as temperatures, concentrations of reaction precursors, or materials of the substrate could be changed without deviation from the spirit and the scope of the present invention.

Embodiment 1

Figure 6:
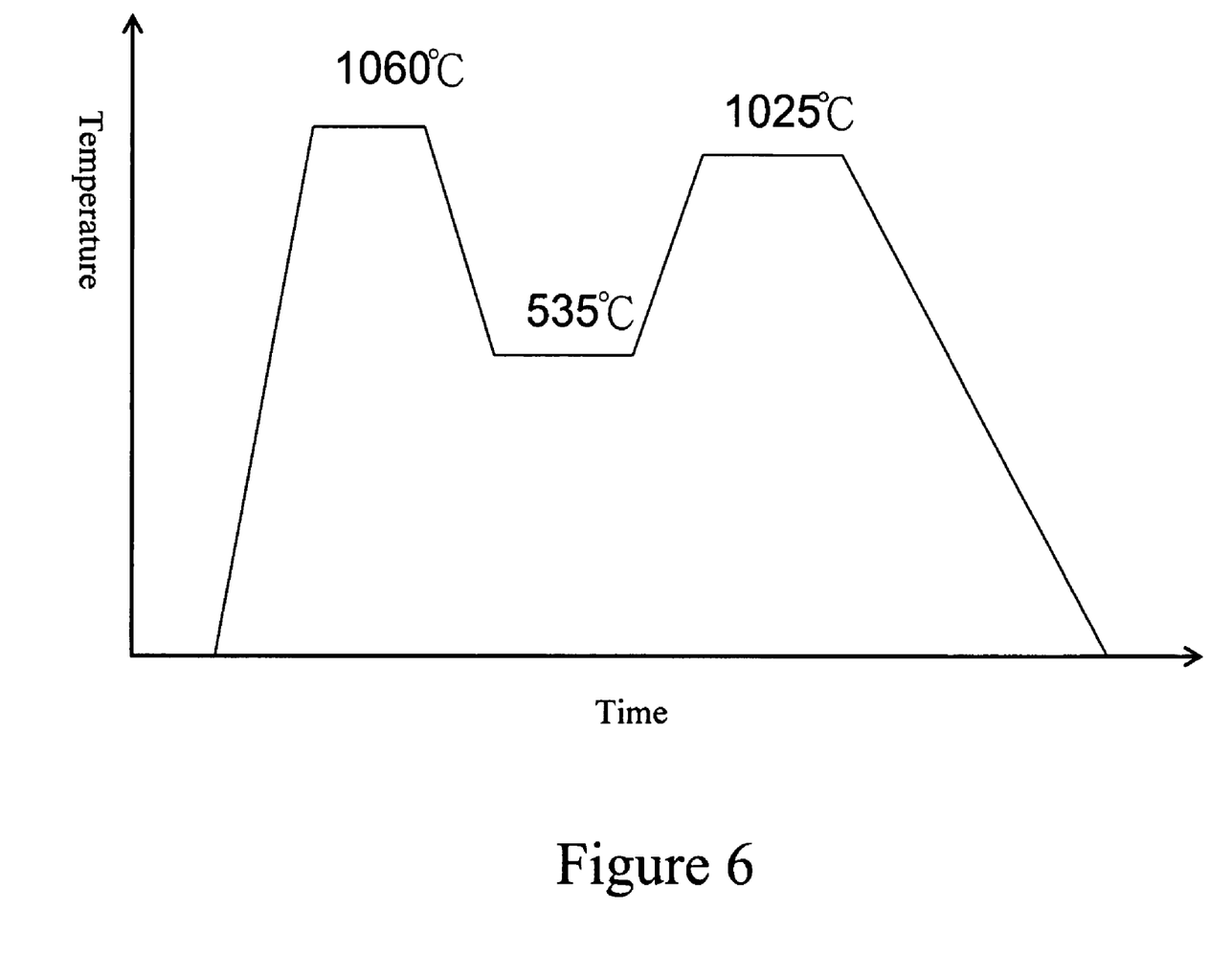
FIG. 6 is a temperature curve with respect to time according to the embodiment 1 of the present invention.

FIG. 6 is a temperature curve with respect to time for the following process steps. First, clean the surface of a sapphire substrate: Place a sapphire substrate on a graphite tray in a chamber of metal-organic chemical vapor deposition (MOCVD). Introduce purified hydrogen and raise the reaction temperature to 1040° C.~1100° C. Herein, take 1060° C. for example. Hold for 5 minutes to carry out thermal cleaning on the surface of the substrate.

Next, proceed with surface treatment on the substrate: Reduce the temperature in the chamber down to 400° C.~700° C. Herein, take 535° C. for example. Set this temperature as the first temperature. In the meantime, introduce reaction precursors $NH_3$ at the flowrate of 15 slm, and $Cp_2Mg$ at the flowrate of 0.18 umol/min for 5 seconds to 180 seconds. Herein, take 1 minute for example.

Finally, proceed with growth of gallium nitride-based buffer layers: When entering this procedure, first stop the supply of the reaction precursor $Cp_2Mg$ and introduce the reaction precursor trimethylgallium (TMGa) at the flowrate of 100 umol/min instead, for 5 seconds to 180 seconds. Herein, take 2 minutes for example. Then a low-temperature gallium nitride-based buffer layer with a thickness between 55 Å to 400 Å, taking 250 Å for example, will form on the surface of the substrate after surface treatment. Afterwards, stop the supply of the reaction precursor TMGa and raise the temperature in the chamber to the second temperature 900° C.~1030° C., taking 1025° C. for example. Introduce reaction precursors TMGa at the flowrate of 200 umol/min, and $NH_3$ at the flowrate of 12 slm to form a high-temperature gallium nitride-based buffer layer with an approximate thickness of 0.2 to 6 μm. The dislocation density of the high-temperature gallium nitride-based buffer layer fabricated by the method is approximately $8 \times 10^8$ cm$^{-2}$.

Embodiment 2

Figure 7:
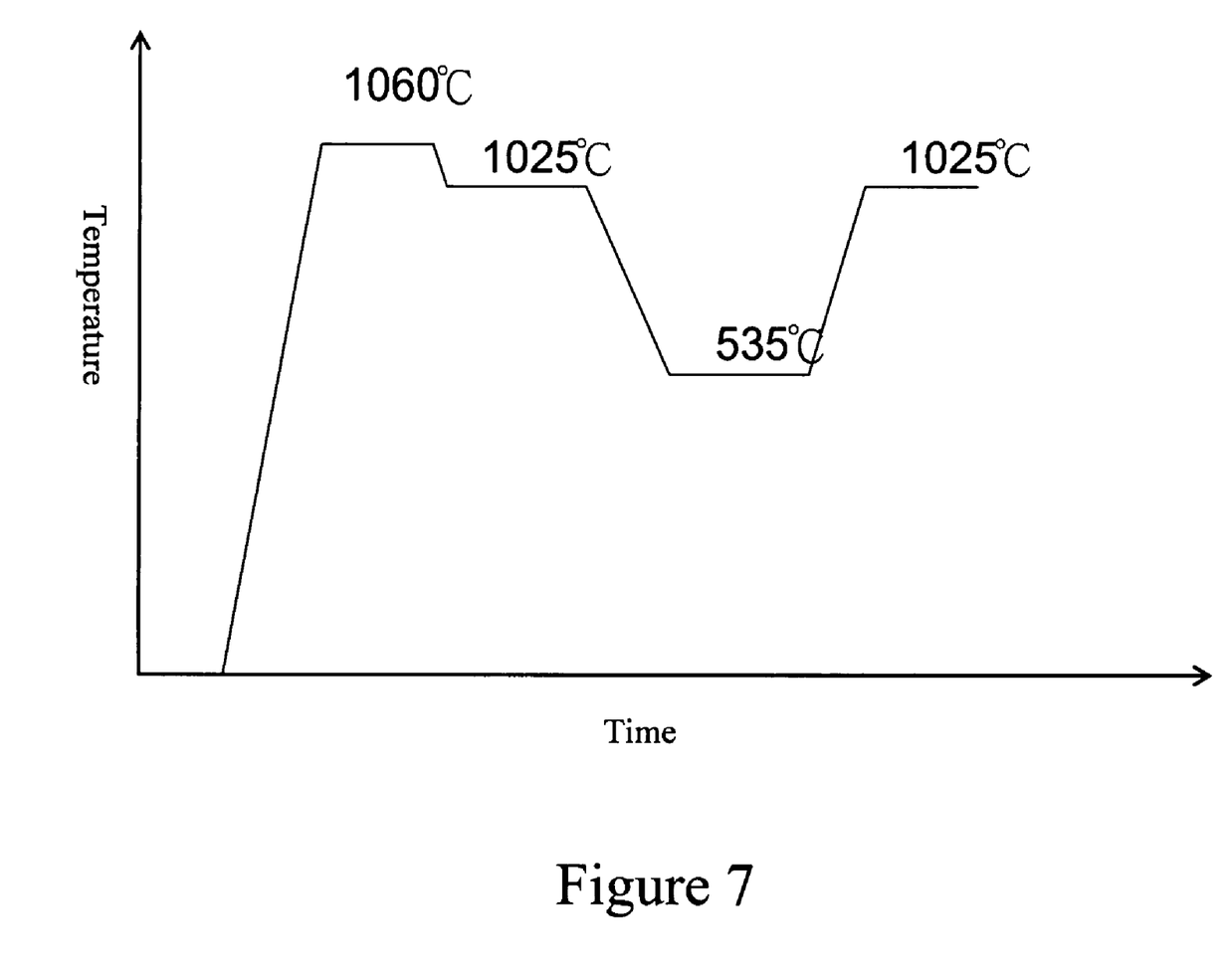
FIG. 7 is a temperature curve with respect to time according to the embodiment 2 of the present invention.

FIG. 7 is a temperature curve with respect to time for the following process steps. First, clean the surface of a sapphire substrate: Place a sapphire substrate on a graphite tray in a chamber of MOCVD. Introduce purified hydrogen and raise the reaction temperature to 1040° C.~1100° C. Herein, take 1060° C. for example. Hold for 5 minutes to carry out thermal cleaning on the surface of the substrate.

Next, proceed with surface treatment on the substrate: Reduce the temperature in the chamber down to 1025° C. and set this temperature as the first temperature. In the meantime, introduce reaction precursors $NH_3$ at the flowrate of 15 slm, and $Cp_2Mg$ at the flowrate of 0.18 umol/min for 1 minute to form a magnesium nitride compound layer with an approximate thickness of 30 Å on the surface of the substrate.

Finally, proceed with growth of gallium nitride-based buffer layers: When entering this procedure, first stop the supply of the reaction precursor $Cp_2Mg$. Reduce the temperature to 535° C. and introduce the reaction precursor TMGa at the flowrate of 100 umol/min instead for 2 minutes. Then a low-temperature gallium nitride-based buffer layer with an approximate thickness of 220 Å will form on the surface of the substrate after surface treatment. Afterwards, raise the reaction temperature to 1025° C., and introduce reaction precursors TMGa at the flowrate of 200 umol/min, and $NH_3$ at the flowrate of 12 slm to form a high-temperature gallium nitride-based buffer layer with an approximate thickness of 0.2 to 6 μm on the low-temperature gallium nitride-based buffer layer. The dislocation density of the high-temperature gallium nitride-based buffer layer fabricated by the method is approximately $5 \times 10^8$ cm$^{-2}$.

Embodiment 3

Figure 8:
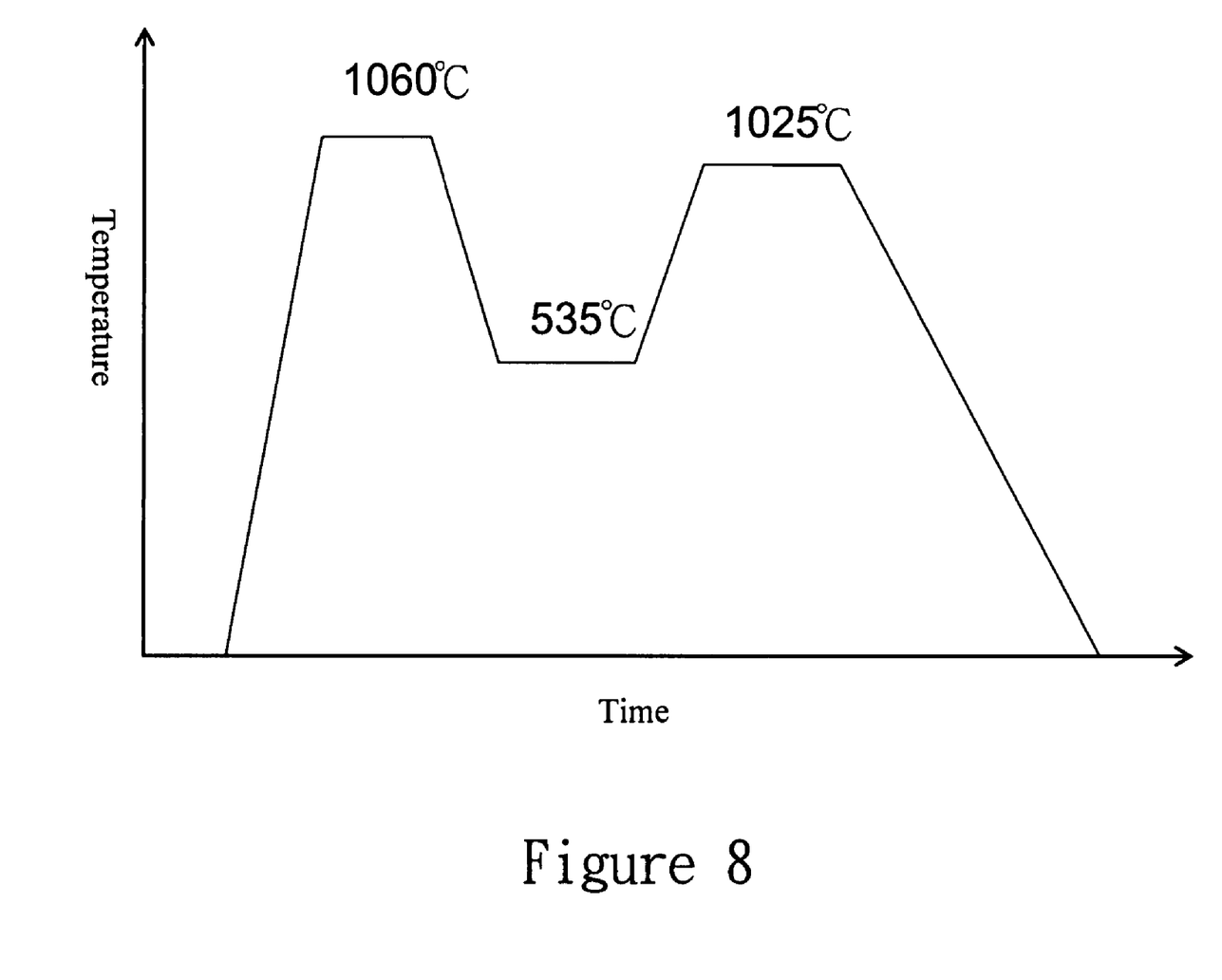
FIG. 8 is a temperature curve with respect to time according to the embodiment 3 of the present invention.

FIG. 8 is a temperature curve with respect to time for the following process steps. First, clean the surface of a sapphire substrate: Place a sapphire substrate on a graphite tray in a chamber of MOCVD. Introduce purified hydrogen and raise the reaction temperature to 1040° C.~1100° C. Herein, take 1060° C. for example. Hold for 5 minutes to carry out thermal cleaning on the surface of the substrate.

Next, proceed with surface treatment on the substrate: Reduce the temperature in the chamber down to 535° C. and set this temperature as the first temperature. In the meantime, introduce reaction precursors $NH_3$ at the flowrate of 15 slm, and $Cp_2Mg$ at the flowrate of 0.18 umol/min for 12 minutes.

Then, proceed with growth of gallium nitride-based buffer layers: Stop the supply of the reaction precursor $Cp_2Mg$ but introduce the reaction precursor TMGa at the flowrate of 20 umol/min for 20 seconds to form firstly a low-temperature gallium nitride-based buffer layer with an approximate average thickness of 40 Å per layer on the surface of the substrate after surface treatment. After that, proceed with surface treatment on the low-temperature gallium nitride-based buffer layer with the process parameters used in the surface treatment on the surface of the substrate. After repeating such a process of forming a low-temperature gallium nitride-based buffer layer and surface treatment on the low-temperature gallium nitride-based buffer layer for several times, a low-temperature gallium nitride-based stacked buffer layer stacked by a plurality of low-temperature gallium nitride-based buffer layers with surface treatment being carried out therebetween is formed.

In addition, the thickness of the top low-temperature gallium nitride-based buffer layer on the low-temperature gallium nitride-based stacked buffer layer can increase slightly. In this embodiment, it is 50 Å.

Afterwards, stop the supply of the reaction precursors $Cp_2Mg$ and TMGa, and raise the temperature in the chamber to the second temperature 1025° C. Introduce reaction precursors TMGa at the flowrate of 200 umol/min, and $NH_3$ at the flowrate of 12 slm to form a high-temperature gallium nitride-based buffer layer with an approximate thickness of 0.2 to 6 μm. The dislocation density of the high-temperature gallium nitride-based buffer layer fabricated by the method is approximately $1.5 \times 10^8$ cm$^{-2}$.

Embodiment 4

Figure 9:
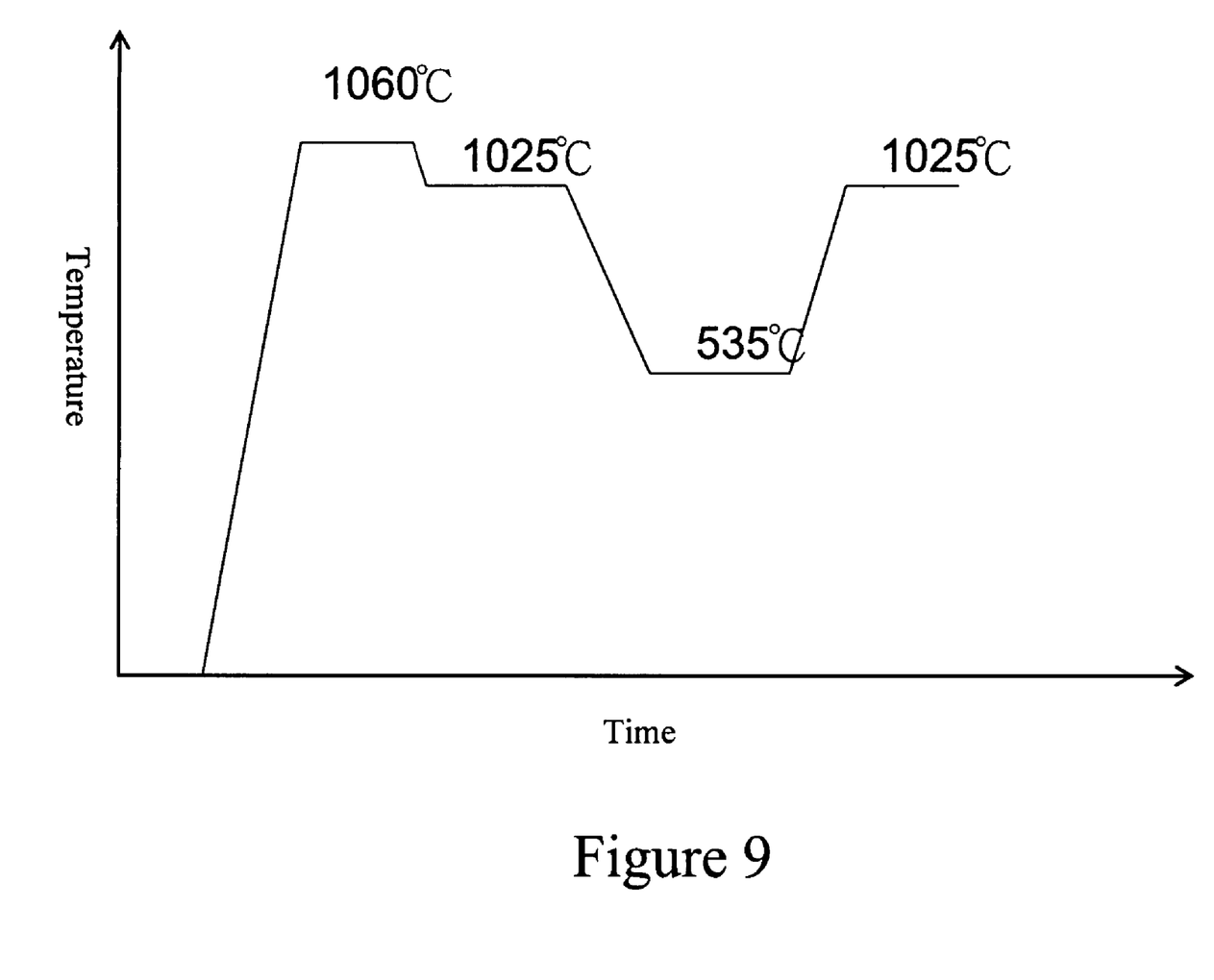
FIG. 9 is a temperature curve with respect to time according to the embodiment 4 of the present invention.

FIG. 9 is a temperature curve with respect to time for the following process steps. First, clean the surface of a sapphire substrate: Place a sapphire substrate on a graphite tray in a chamber of MOCVD. Introduce purified hydrogen and raise the reaction temperature to 1040° C.~1100° C. Herein, take 1060° C. for example. Hold for 5 minutes to carry out thermal cleaning on the surface of the substrate.

Next, proceed with surface treatment on the substrate: Reduce the temperature in the chamber down to 1025° C. and set this temperature as the first temperature. In the meantime, introduce reaction precursors $NH_3$ at the flowrate of 15 slm, and $Cp_2Mg$ at the flowrate of 0.18 umol/min for 12 seconds to form a magnesium nitride compound (MgNx) layer with an approximate thickness of 6 Å.

After that, stop the supply of the reaction precursor $Cp_2Mg$ but introduce the reaction precursor TMGa at the flowrate of 20 umol/min for 40 seconds to form a first gallium nitride-based buffer layer with an approximate average thickness of 6 Å on the surface of the high-temperature magnesium nitride compound layer. After repeating such a process of forming a magnesium nitride compound layer and the first gallium nitride-based buffer layer for several times, a stacked layer stacked by interlacing the magnesium nitride compound layers and the first gallium nitride-based buffer layer is formed.

Next, form a second gallium nitride-based buffer layer on the stacked layer with the process parameters used for forming the first gallium nitride-based buffer layer.

Then, stop the supply of the reaction precursor TMGa and reduce the temperature in the chamber to the second temperature 535° C. Introduce the reaction precursor TMGa at the flowrate of 20 umol/min for 85 seconds to form a low-temperature gallium nitride-based buffer layer with an approximate thickness of 170 Å.

Afterwards, stop the supply of the reaction precursor TMGa and raise the temperature in the chamber to the third temperature 1025° C. Introduce reaction precursors TMGa at the flowrate of 200 umol/min, and $NH_3$ at the flowrate of 12 slm to form a high-temperature gallium nitride-based buffer layer with an approximate thickness of 0.2 to 6 μm. The dislocation density of the high-temperature gallium nitride-based buffer layer fabricated by the method is approximately $3.5 \times 10^8$ cm$^{-2}$.

Embodiment 5

First, use a sapphire as the substrate. According to the method for forming the buffer layer disclosed in Embodiment 3, form a high-temperature gallium nitride-based buffer layer on the low-temperature gallium nitride-based stacked buffer layer with an approximate thickness of 1~2 μm. Next, form sequentially an n-type gallium nitride-based contact layer with a thickness of 2~3 μm, a gallium nitride-based light-emitting layer, a p-type gallium nitride-based over layer, and a p-type gallium nitride-based contact layer with a thickness of 0.2~0.8 μm on the high-temperature gallium nitride-based buffer layer. The gallium nitride-based light-emitting layer includes at least an indium gallium nitride layer, and a multiple quantum well structure formed by the indium gallium nitride layer and aluminum indium gallium nitride. Then, in terms of the manufacturing method of chips in the prior art, form lateral electrode structures and use indium tin oxide (ITO) as a transparent conductive layer. The chip size is 380×320 μm. For the blue-light LED manufactured according to the present embodiment, when an operating current of 20 mA is input, the optical output power can reach 12 mW with an operating voltage below 3.3 Volts. More, by using the surface meshed epitaxial structure disclosed in Taiwan patent number 1236160, the optical output power can be further enhanced to 14.5 mW. In addition to ITO, the transparent conductive layer described in the present embodiment can include IZO, GZO, TCO, IMO, AZO, MZO, and ICeO in the prior art.

To sum up, the present invention uses reaction precursors $Cp_2Mg$ and $NH_3$ to carry out treatment on the surface of the substrate to change the surface energy thereof. Accompanying with multiple, low- and high-temperature gallium nitride-based buffer layers, the dislocation density in the gallium nitride-based buffer layers, which is used to contact with the light-emitting device part, can be reduced significantly to minimum. Accordingly, the luminance efficiency and the product yield can be enhanced.

However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for forming epitaxial layers of gallium nitride-based compound semiconductors, comprising the steps of:
    providing a substrate;
    surface treating the substrate using reaction precursors $Cp_2Mg$ and $NH_3$ to form the magnesium nitride layer thereon;
    lowering the reaction temperature and forming a low-temperature gallium nitride-based buffer layer; and
    forming a high-temperature gallium nitride-based buffer layer on the low-temperature gallium nitride-based buffer layer.

2. The method for forming epitaxial layers of gallium nitride-based compound semiconductors of claim 1, wherein the step of surface treating the substrate using reaction precursors $Cp_2Mg$ and $NH_3$ is carried out at an approximate reaction temperature of 1025° C. to form the magnesium nitride layer thereon.

3. The method for forming epitaxial layers of gallium nitride-based compound semiconductors of claim 1, and further forming sequentially an n-type gallium nitride-based contact layer, a light-emitting layer, a p-type gallium nitride-based over layer, and a p-type gallium nitride-based contact layer on the high-temperature gallium nitride-based buffer layer.

4. The method for forming epitaxial layers of gallium nitride-based compound semiconductors of claim 3, wherein the light-emitting layer includes at least an indium gallium nitride layer, and a multiple quantum well structure formed by the indium gallium nitride layer and aluminum indium gallium nitride.

5. The method for forming epitaxial layers of gallium nitride-based compound semiconductors of claim 1, wherein the step of surface treating the substrate includes the step of forming the magnesium nitride layer with a thickness within an approximate range of 6-30 Å.

* * * * *